United States Patent
Kikuchi

(10) Patent No.: US 7,460,400 B1
(45) Date of Patent: Dec. 2, 2008

(54) NONVOLATILE MEMORY UTILIZING MIS MEMORY TRANSISTORS WITH BIT MASK FUNCTION

(75) Inventor: Takashi Kikuchi, Fukuoka (JP)

(73) Assignee: NSCore Inc., Fukuoka (JP)

( * ) Notice: Subject to any disclaimer, the term of this patent is extended or adjusted under 35 U.S.C. 154(b) by 0 days.

(21) Appl. No.: 11/843,190

(22) Filed: Aug. 22, 2007

(51) Int. Cl.
G11C 16/04 (2006.01)

(52) U.S. Cl. .................. 365/185.05; 365/185.23; 365/189.08

(58) Field of Classification Search ........... 365/185.05, 365/185.23, 189.05, 189.07, 189.08, 230.06, 365/230.08, 154, 156
See application file for complete search history.

(56) References Cited

U.S. PATENT DOCUMENTS

| | | | |
|---|---|---|---|
| 3,636,530 A | 1/1972 | Mark et al. | |
| 4,419,744 A | 12/1983 | Rutter | |
| 4,791,607 A * | 12/1988 | Igarashi et al. ............... | 365/51 |
| 5,644,548 A * | 7/1997 | Kitsukawa et al. ..... | 365/230.06 |
| 5,956,269 A | 9/1999 | Ouyang et al. | |
| 6,038,168 A | 3/2000 | Allen et al. | |
| 6,064,590 A | 5/2000 | Han et al. | |
| 6,614,684 B1 * | 9/2003 | Shukuri et al. ......... | 365/185.05 |
| 6,740,927 B1 | 5/2004 | Jeng | |
| 6,906,953 B2 | 6/2005 | Forbes | |
| 6,906,962 B2 | 6/2005 | Layman et al. | |
| 6,909,635 B2 | 6/2005 | Forbes et al. | |
| 7,227,234 B2 | 6/2007 | Roizin et al. | |
| 2004/0232477 A1 | 11/2004 | Iwata et al. | |
| 2004/0252554 A1 | 12/2004 | Fournel et al. | |

FOREIGN PATENT DOCUMENTS

| | | |
|---|---|---|
| JP | 6-76582 | 3/1994 |
| JP | 6-231587 | 8/1994 |
| JP | 2001-156188 | 6/2001 |
| JP | 2002-237540 | 8/2002 |
| WO | WO2004/057621 | 7/2004 |
| WO | 2006/093629 | 9/2006 |

* cited by examiner

Primary Examiner—Gene N. Auduong
(74) Attorney, Agent, or Firm—Ladas & Parry LLP

(57) ABSTRACT

A nonvolatile semiconductor memory device includes a plurality of control lines, a control circuit configured to assert selected ones of the control lines, and a plurality of memory cell arranged in rows and columns and including respective latch circuits and respective nonvolatile memory cells, wherein the memory cell units are configured to perform a write operation in which the latch circuits of the memory cell units on a selected row store respective bits of the input data, and are further configured to perform a store operation in which the respective bits of the input data are transferred from the latch circuits to the nonvolatile memory cells for storage therein in response to assertion of respective control lines by the control circuit, so that only one or more selective bits of the input data selected by the control circuit are stored in the nonvolatile memory cells.

11 Claims, 13 Drawing Sheets

NONVOLATILE MEMORY UTILIZING MIS MEMORY TRANSISTORS WITH BIT MASK FUNCTION

BACKGROUND OF THE INVENTION

1. Field of the Invention

The present invention generally relates to a memory circuit, and particularly relates to a nonvolatile memory circuit which is capable of retaining stored data in the absence of a power supply voltage.

2. Description of the Related Art

Nonvolatile semiconductor memory devices, which can retain stored data even when power is turned off, conventionally include flash EEPROM employing a floating gate structure, FeRAM employing a ferroelectric film, MRAMs employing a ferromagnetic film, etc. There is a new type of nonvolatile semiconductor memory device called Perm-SRAM. PermSRAM uses a pair of MIS (metal-insulating film-semiconductor) transistors as a nonvolatile memory cell (i.e., the basic unit of data storage). The MIS transistors used as a nonvolatile memory cell in PermSRAM have the same structure as ordinary MIS transistors used for conventional transistor functions (e.g., switching function), and do not require a special structure such as a floating gate or a special material such as a ferroelectric material or ferromagnetic material. The absence of such a special structure and special material offers an advantage in cost reduction. PermSRAM was initially disclosed in PCT/JP2003/016143, which was filed on Dec. 17, 2003, the entire contents of which are hereby incorporated by reference.

The MIS transistors used as a nonvolatile memory cell in PermSRAM are configured to experience an irreversible hot-carrier effect on purpose for storage of one-bit data. Here, the irreversible hot-carrier effect refers to the injection of electrons into the oxide film. A difference in the transistor characteristics caused by the hot-carrier effect represents one-bit data "0" or "1". Such a difference may be detected as a difference in the ON current between the two transistors by using a sensing circuit such as a one-bit static memory circuit (latch) coupled to the MIS transistor pair.

Each memory cell unit of PermSRAM for storing on-bit data is comprised of a latch circuit and a nonvolatile memory cell. Data supplied from an external source to a PermSRAM are initially written to the latch circuits of the memory cell units corresponding to a selected row. After the writing of data to the latch circuits, a store operation is performed to transfer (copy) the data from the latch circuits to the respective nonvolatile memory cells. In each memory cell unit, the store operation causes a selected one of the two MIS transistors constituting the nonvolatile memory cell to experience a hot-carrier effect, and which one is selected depends on whether the data stored in the latch circuit is 0 or 1.

Such store operation may be performed on a row-by-row basis (i.e., word-line-specific basis), or may be performed with respect to all the memory cell units (i.e., with respect to the entirety of the PermSRAM). No mechanism has been provided in PermSRAM, however, to perform store operation on a column-by-column basis (i.e., bit-line-specific basis). In other words, no mask function that would allow some of the data bits stored in the latch circuits to be masked and not transferred to the nonvolatile memory cells has been available in PermSRAM.

There is thus a need for PermSRAM that is provided with a mask function.

SUMMARY OF THE INVENTION

It is a general object of the present invention to provide a nonvolatile semiconductor memory device that substantially obviates one or more problems caused by the limitations and disadvantages of the related art.

It is another and more specific object of at least one embodiment of the present invention to provide a PermSRAM that is provided with a mask function.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a nonvolatile semiconductor memory device particularly pointed out in the specification in such full, clear, concise, and exact terms as to enable a person having ordinary skill in the art to practice the invention.

To achieve these and other advantages in accordance with the purpose of the invention, the invention provides a nonvolatile semiconductor memory device which includes a data input buffer to receive input data, a plurality of control lines, a control circuit configured to assert selected ones of the control lines, and a plurality of memory cell units arranged in rows and columns and including respective latch circuits and respective nonvolatile memory cells, each nonvolatile memory cell being coupled to a corresponding latch circuit in a corresponding memory cell unit, the memory cell units on a common row being coupled to the respective control lines, wherein the memory cell units are configured to perform a write operation in which the latch circuits of the memory cell units on a selected row store respective bits of the input data, and are further configured to perform a store operation in which the respective bits of the input data are transferred from the latch circuits to the nonvolatile memory cells for storage therein in response to assertion of respective control lines by the control circuit, so that only one or more selective bits of the input data selected by the control circuit are stored in the nonvolatile memory cells.

According to at least one embodiment of the present invention, bit-specific masking is performed so as to prevent data from being transferred from the latch circuit to the nonvolatile memory cell on a selected bit position.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

The present invention is directed to PermSRAM. Namely, a memory cell includes a pair of MIS (metal-insulating film-semiconductor) transistors that have the same structure as ordinary MIS transistors used for conventional transistor functions (e.g., switching function). Namely, these memory cell transistors use neither a special structure such as a floating gate nor a special material such as a ferroelectric material or a ferromagnetic material. These MIS transistors are configured to experience a hot-carrier effect on purpose for storage of one-bit data.

The hot-carrier effect leaves an irreversible lingering change in the transistor characteristics. Changes in the characteristics of the MIS transistors caused by the hot-carrier effect achieve a nonvolatile data retention. Which one of the MIS transistors has a strong lingering change determines whether the stored data is "0" or "1".

Further, a latch (flip-flop) circuit is used to determine data to be stored in the nonvolatile-memory-cell MIS transistors. The latch circuit is also used to read (sense) the data stored in the nonvolatile-memory-cell MIS transistors. The latch circuit and the nonvolatile-memory-cell MIS transistors together constitute a memory cell (memory circuit).

In the following description, NMOS transistors are used as examples of the nonvolatile-memory-cell MIS transistors, but such examples are not intended to be limiting. PMOS transistors may as well be used as nonvolatile-memory-cell transistors.

Figure 1:
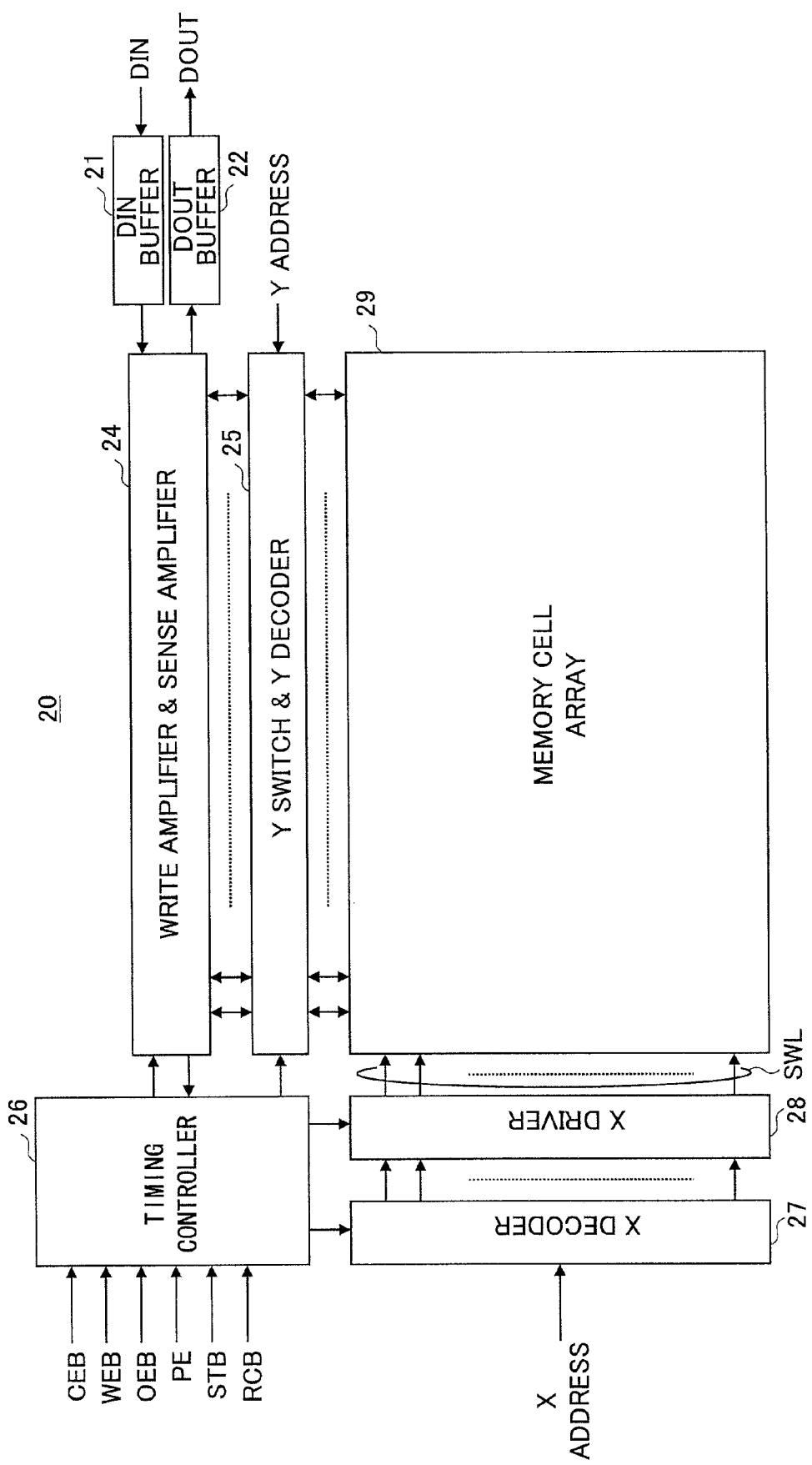
FIG. 1 is a block diagram showing an example of the configuration of a nonvolatile semiconductor memory device according to the present invention.

FIG. 1 is a block diagram showing an example of the configuration of a nonvolatile semiconductor memory device according to the present invention. A semiconductor memory device 20 shown in FIG. 1 includes a DIN buffer 21, a DOUT buffer 22, a write-amplifier-&-sense-amplifier unit 24, a Y-switch-&-Y-decoder unit 25, a timing controller 26, an X decoder 27, an X driver 28, and a memory cell array 29.

The memory cell array 29 includes a plurality of memory cells arranged in a matrix form, with a plurality of word lines extending in a first direction, and a plurality of bit lines extending in a second direction perpendicular to the first direction. Each memory cell has a circuit configuration as will later be described. The memory cells arranged in the same column are connected to the same bit lines, and the memory cells arranged in the same row are connected to the same word line.

The timing controller 26 receives control signals from outside the semiconductor memory device 20, and decodes the control signals to determine an operation mode (e.g., a write operation mode or a read operation mode). These control signals include a store enable signal STB, a recall enable signal RCB, an output enable signal OEB, a write enable signal WEB, a chip enable signal CEB, and a partial enable signal PE. Timing control signals responsive to the determined operation mode are supplied from the timing controller 26 to the write-amplifier-&-sense-amplifier unit 24, the Y-switch-&-Y-decoder unit 25, the X decoder 27, and the X driver 28 for control of the individual parts of the semiconductor memory device 20.

The X decoder 27 receives an X address input from outside the semiconductor memory device 20, and decodes the X address input to determine a selected row. In response to the timing control signals from the timing controller 26 and the decode signals from the X decoder 27, the X driver 28 activates a selected SRAM word line SWL among the SRAM word lines SWL extending from the X driver 28. As a result of the activation of the selected SRAM word line SWL, the corresponding volatile memory units are coupled to respective bit line pairs. Through this coupling, the writing/reading of data to/from the volatile memory portions is performed.

Data read from the memory cell array 29 is supplied to the sense-amplifier-&-write-amplifier unit 24 via the Y-switch-&-Y-decoder unit 25. Sense amplifiers of the sense-amplifier-&-write-amplifier unit 24 amplify the data supplied from the memory cell array 29 for provision to the DOUT buffer 22. The data is output from the DOUT buffer 22 to outside the semiconductor memory device 20 as output data DOUT. Input data DIN supplied to the DIN buffer 21 is provided to the sense-amplifier-&-write-amplifier unit 24. Write amplifiers of the sense-amplifier-&-write-amplifier unit 24 amplify the input data for provision to the memory cell array 29 via the Y-switch-&-Y-decoder unit 25.

The Y-switch-&-Y-decoder unit 25 receives a Y address from outside the semiconductor memory device 20. In response to the Y address, the Y-decoder-&-Y-switch unit 25 couples the sense-amplifier-&-write-amplifier unit 24 to a corresponding portion of the memory cell array 29. Output data DOUT and input data DIN may have a width of 16 bits, and the memory cell array 29 may have a width of 64 bits for each X address. In this case, the Y address input into the Y-switch-&-Y-decoder unit 25 may be comprised of 2 bits, and selects a 16-bit portion of the 64-bit width of the memory cell array 29.

Further, the Y-switch-&-Y-decoder unit 25 serves to provide a mask function according to the embodiment of the present invention. With this mask function, a bit-specific store operation is achieved as will later be described.

Figure 2:
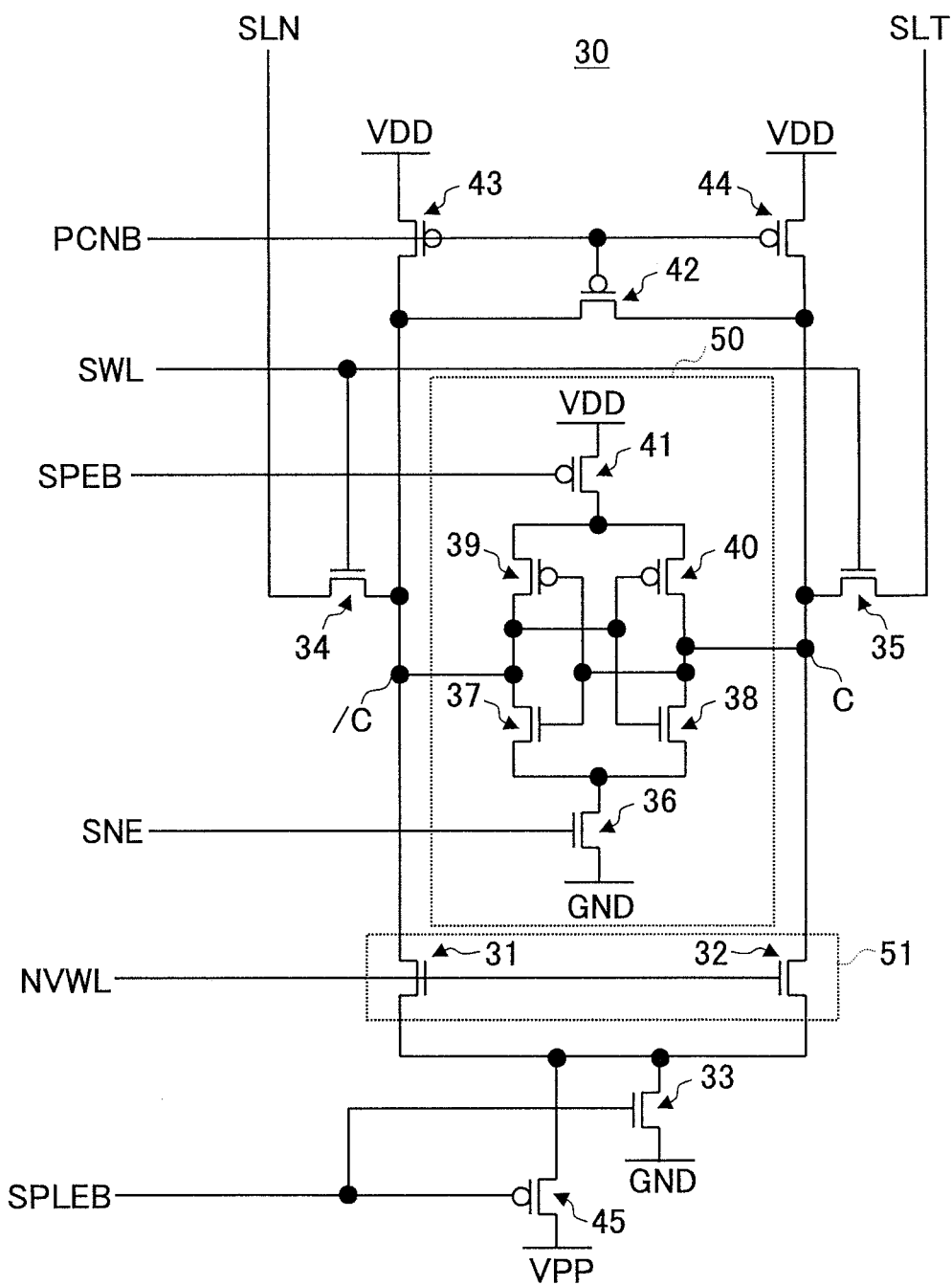
FIG. 2 is an illustrative drawing showing an example of the configuration of a memory cell unit used in a memory cell array of FIG. 1.

FIG. 2 is an illustrative drawing showing an example of the configuration of a memory cell unit used in the memory cell array 29 of FIG. 1. Each memory cell unit of the memory cell array 29 has the circuit configuration as shown in FIG. 2.

A memory cell unit 30 of FIG. 2 includes NMOS transistors 31 through 38 and PMOS transistors 39 through 45. The NMOS transistors 31 and 32 are a pair of MIS transistors serving as a nonvolatile memory cell 51, and have their gate nodes coupled to an NV word line NVWL. The NMOS transistors 36 through 38 and PMOS transistors 39 and 41 together constitute an SRAM (Static Random Access Memory) cell 50 (i.e., latch circuit), which serves as a sensing circuit to sense data stored in the nonvolatile memory cell 51.

The NMOS transistors 31 and 32 serving as nonvolatile memory cell transistors have the same structure as the other NMOS transistors including the NMOS transistors 36 through 38 used in respect of the SRAM cell 50 and the NMOS transistors 34 and 35 used as a transfer gate between the SRAM cell 50 and SRAM data lines (bit lines) SLN and SLT. Further, it is preferable to manufacture all the MOS transistors of the memory cell unit 30 with the same thickness of a gate oxide film. Namely, all the MOS transistors shown in FIG. 2 may be designed to operate with the same operating voltage (e.g., 1.8 V).

As shown in FIG. 2, the SRAM data lines SLN and SLT, which extend from Y-switch-&-Y-decoder unit 25, are coupled to the SRAM cell 50 via the NMOS transistors 34 and 35 serving as a data transfer unit. An SRAM word line SWL, which extends from the X driver 28, is connected to the gates of the NMOS transistors 34 and 35. The NV word line NVWL, which extends from the X driver 28, is coupled to the gate nodes of the NMOS transistors 31 and 32 serving as the nonvolatile memory cell 51.

Further, a cell precharge line PCNB and a store plate voltage enable line SPLEB extend from the X driver 28, and are connected to the memory cell unit 30. The cell precharge line PCNB is coupled to the gates of the PMOS transistors 42 through 44 for the purpose of precharging and equalizing nodes C and /C. The store plate voltage enable line SPLEB is coupled to the gate of the NMOS transistor 33. In response to the HIGH state of the store plate voltage enable line SPLEB, the NMOS transistor 33 becomes conductive, and the data stored in the nonvolatile memory cell 51 is recalled through recall operation, i.e., the data stored in the NV cell unit 51 is transferred to the SRAM cell 50. The store plate voltage enable line SPLEB is also coupled to the gate of the PMOS transistor 45. In response to the LOW state of the store plate voltage enable line SPLEB, the PMOS transistor 45 becomes conductive, so that the data stored in the SRAM cell 50 is stored in the nonvolatile memory cell 51 through store operation, i.e., the data stored in the SRAM cell 50 is transferred to the nonvolatile memory cell 51.

Such recall operation and store operation are effective only when the SRAM cell 50 is activated. In order to disable the store operation for the purpose of a bit-specific mask function, thus, the active/inactive state of the SRAM cell 50 may be controlled on a bit-specific basis. To this end, provision is made such that an SRAM NMOS enable line SNE and an SRAM PMOS enable line SPEB extend from the Y-switch-&-Y-decoder unit 25, and are connected to the memory cell unit 30. The SRAM NMOS enable line SNE and SRAM PMOS enable line SPEB are coupled to the gate of the NMOS transistor 36 and to the gate of the PMOS transistor 41, respectively, so as to control the on/off state of the SRAM cell 50. In this embodiment, the Y-switch-&-Y-decoder unit 25 controls the activation of the SRAM NMOS enable line SNE and SRAM PMOS enable line SPEB on a bit-specific basis, thereby achieving bit-specific masking operation.

Figure 3:
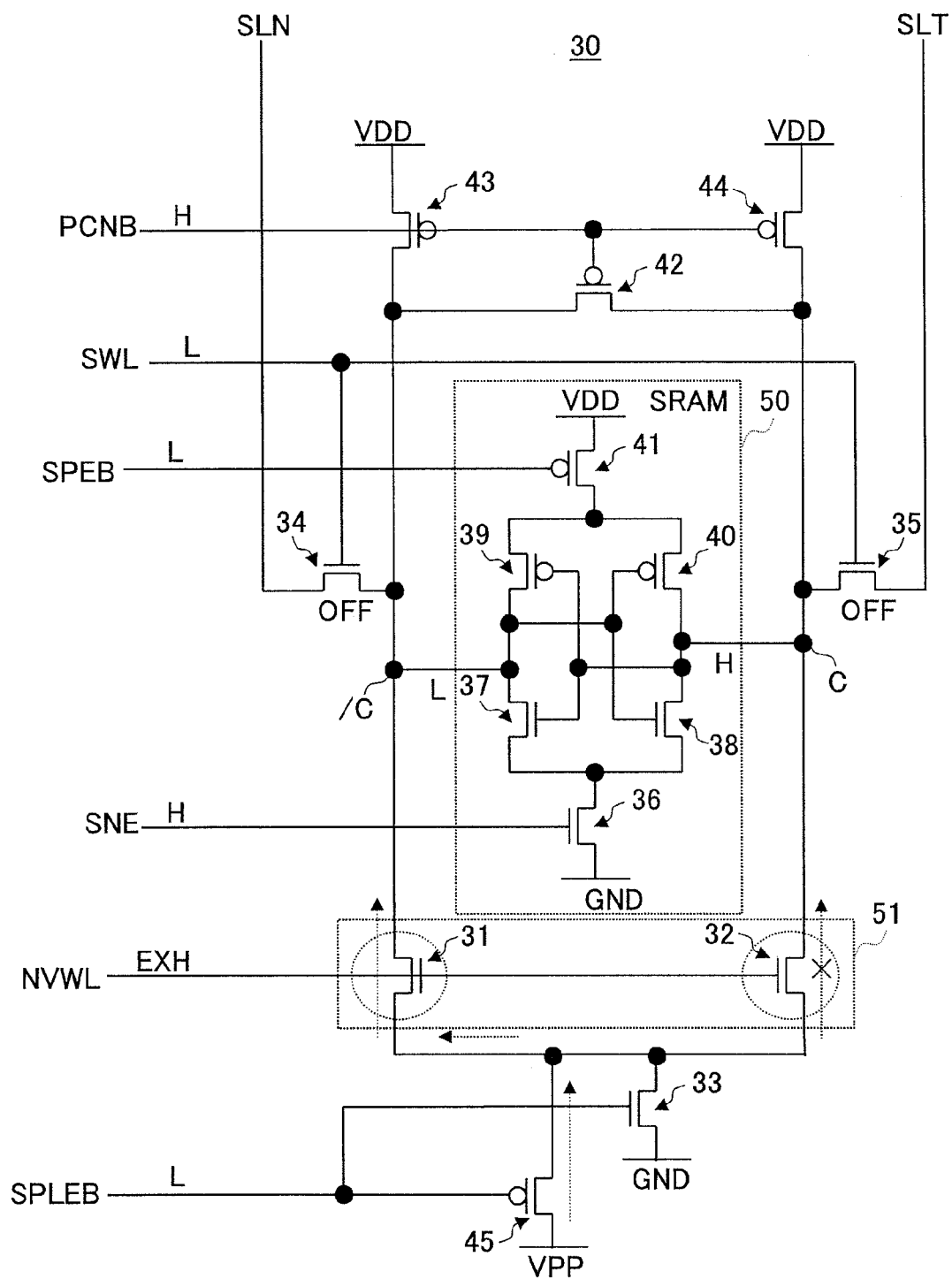
FIG. 3 is a drawing for explaining a store operation that successfully transfers data from a SRAM cell to a nonvolatile memory cell.

FIG. 3 is a drawing for explaining a store operation that successfully transfers data from the SRAM cell 50 to the nonvolatile memory cell 51. In FIG. 3, the same elements as those of FIG. 2 are referred to by the same numerals, and a description thereof will be omitted.

In the memory cell unit 30 of FIG. 3, the NMOS transistors 31 and NMOS transistor 32 are conventional MIS (metal-insulating film-semiconductor) transistors designed to operate with a power supply voltage of 1.8 V, for example. Namely, when these transistors are driven with a voltage no greater than 1.8 V, a change in the characteristics due to a hot-carrier effect does not occur from a practical point of view.

In the example shown in FIG. 3, the SRAM NMOS enable line SNE and the SRAM PMOS enable line SPEB are set to HIGH and LOW, respectively, thereby turning on both the NMOS transistor 36 and the PMOS transistor 41. The SRAM cell 50 is thus placed in an active state. The electrical nodes C and /C of the SRAM cell 50 are set to respective potentials that are inverse to each other according to the data stored in the SRAM cell 50. For example, the electrical node /C may be set to LOW (=0 V), and the electrical node C may be set to HIGH (=1.8 V), as shown in FIG. 3.

During a store operation, the store plate voltage enable line SPLEB is set to LOW (i.e., 0 V), and the potential of the NV word line NVWL is set to EXH, which is a voltage (e.g., 1.65 V) between 0 V and VPP (3.3 V). This NV word line potential EXH is determined such as to maximize the effect of a hot-carrier phenomenon. Generally, such potential is selected to be half the voltage between the source node and drain node of the transistor that is subjected to a hot-carrier effect.

With the signal level settings as described above, a voltage of 3.3 V between VPP and the electrical node /C is applied between the drain node and source node of the NMOS transistor 31. Further, a voltage of 1.65 V between the NV word line potential and the electrical node /C is applied between the gate node and source node of this NMOS transistor 31. Since these bias voltages are larger than the voltages used in routine operations, the NMOS transistor 31 experiences a strong hot-carrier effect.

In this situation, only the NMOS transistor 31 experiences a hot-carrier effect. The NMOS transistor 32 does not experience a hot-carrier effect because a voltage across their drain node and source node is only 1.5 V, which is within the range of voltages used in routine operations. It should also be noted that an electric current does not flow through the NMOS transistor 32 in this case since the gate node voltage is no higher than the source node voltage.

Figure 4:
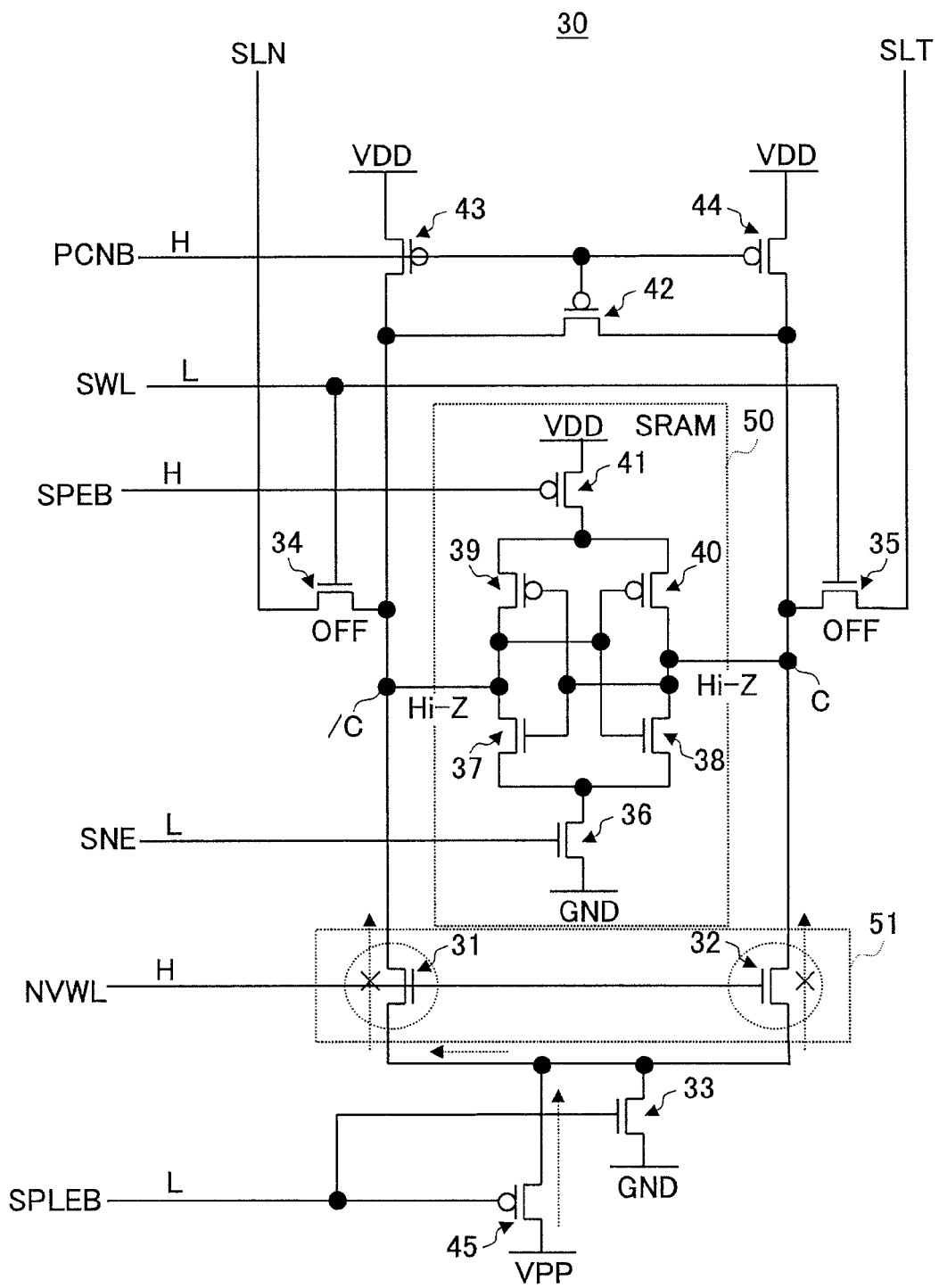
FIG. 4 is a drawing for explaining a bit-specific mask function by which data is prevented from being transferred from the SRAM cell to the nonvolatile memory cell during a store operation.

FIG. 4 is a drawing for explaining a bit-specific mask function by which data is prevented from being transferred from the SRAM cell 50 to the nonvolatile memory cell 51 during a store operation. In FIG. 4, the same elements as those of FIG. 2 are referred to by the same numerals, and a description thereof will be omitted.

In the example shown in FIG. 4, the SRAM NMOS enable line SNE and the SRAM PMOS enable line SPEB are set to LOW and HIGH, respectively, thereby turning off both the NMOS transistor 36 and the PMOS transistor 41. The SRAM cell 50 is thus placed in an inactive state for the purpose of providing a bit-specific mask function. Due to the inactive state of the SRAM cell 50, the electrical nodes C and /C of the SRAM cell 50 are placed in a floating state (high-impedance state) regardless of the data that has been written to the SRAM cell 50. The data that was previously in existence in the SRAM cell 50 ends up being destroyed by the inactive state of the SRAM cell 50. During a store operation, the store plate voltage enable line SPLEB is set to LOW (i.e., 0 V), and the potential of the NV word line NVWL is set to EXH, which is a voltage (e.g., 1.65 V) between 0 V and VPP (3.3 V).

With the signal level settings as described above, neither the NMOS transistor 31 nor the NMOS transistor 32 experiences a hot-carrier effect because no electric current flows through these transistors. Namely, despite the store operation settings in which the store plate voltage enable line SPLEB is set to LOW and the NV word line NVWL is set to EXH, no data transfer occurs from the SRAM cell 50 to the nonvolatile memory cell 51 in this memory cell unit 30. This is because the SRAM cell 50 is placed in an inactive state with respect to this memory cell unit 30 by the Y-switch-&-Y-decoder unit 25.

Figure 5:
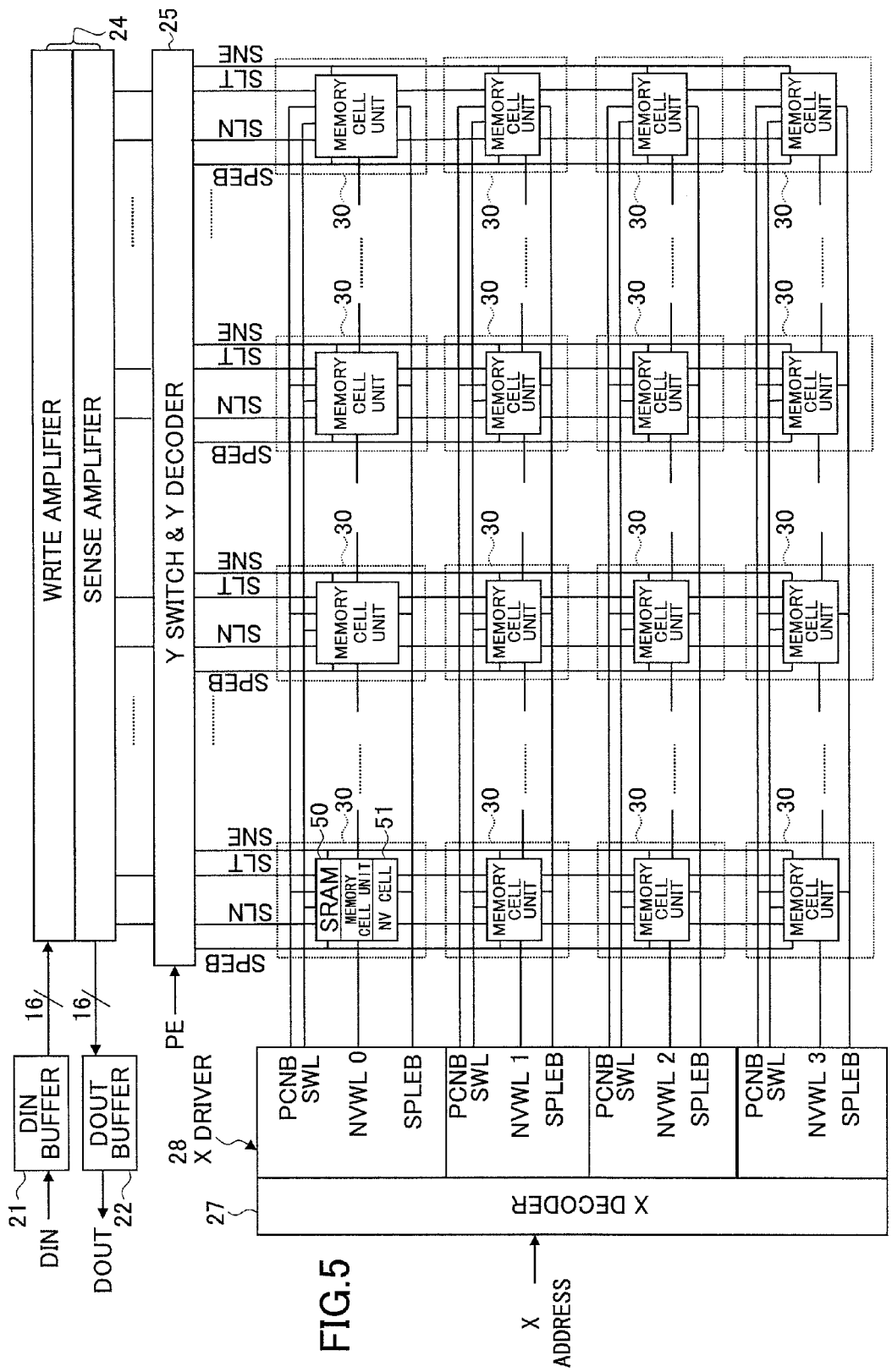
FIG. 5 is a drawing showing a more specific configuration of the memory cell array shown in FIG. 1.

FIG. 5 is a drawing showing a more specific configuration of the memory cell array 29 shown in FIG. 1. In FIG. 5, the same elements as those of FIG. 1 and FIG. 2 are referred to by the same numerals, and a description thereof will be omitted.

The X address may be comprised of 2 bits, for example, to select one of a plurality of rows, the number of which is 4 in this example. The memory cell array 29 shown in FIG. 1 corresponds to a plurality of memory cell units 30, the SRAM data lines SLN and SLT and the enable lines SNE and SPEB extending from write-amplifier-&-sense-amplifier unit 24, and signal lines extending from the X driver 28. Each of the memory cell units 30 has the configuration as shown in FIG. 2, and includes the SRAM cell 50 and the NV cell unit 51. For the sake of clarity of illustration, however, the SRAM cell 50 and the NV cell unit 51 are shown in FIG. 3 only with respect to the memory cell unit 30 situated at the top left corner.

It should be noted that, for the sake of simplicity of explanation, output data DOUT and input data DIN in the example of FIG. 5 have a width of 16 bits, and the memory cell array 29 also has a width of 16 bits for each X address. In this case, no Y address is input into the Y-switch-&-Y-decoder unit 25. The Y-switch-&-Y-decoder unit 25 does not serve as a decoder, and simply serves to provide the bit-specific mask function. In FIG. 5, further, the illustration of the timing controller 26 is omitted for the sake of simplicity of illustration.

The X driver 28 activates a selected SRAM word line SWL to read data from or write data to the SRAM cells 50 with respect to the memory cell units 30 that are connected to the activated SRAM word line SWL. Data transfer between the SRAM cells 50 and the write-amplifier-&-sense-amplifier unit 24 is conducted via the SRAM data lines SLN and SLT.

The X driver 28 may activate one of the NV word lines NVWL0 through NVWL3 at the time of storing data from the SRAM cells 50 to the nonvolatile memory cells 51 and at the time of recalling data to the SRAM cells 50 from the nonvolatile memory cells 51. Alternatively, the X driver 28 may activate all the NV word lines NVWL0 through NVWL3 at once for both the store operation and the recall operation. Choice between these two arrangements may be made according to need.

The Y-switch-&-Y-decoder unit 25 sets the SRAM NMOS enable line SNE and the SRAM PMOS enable line SPEB to HIGH and LOW, respectively, with respect to the bit positions at which data should be transferred from the SRAM cell 50 to the nonvolatile memory cell 51 during store operation. The Y-switch-&-Y-decoder unit 25 sets the SRAM NMOS enable line SNE and the SRAM PMOS enable line SPEB to LOW and HIGH, respectively, with respect to the bit positions at which data should be masked and prevented from being transferred from the SRAM cell 50 to the nonvolatile memory cell 51 during the store operation.

Figure 6:
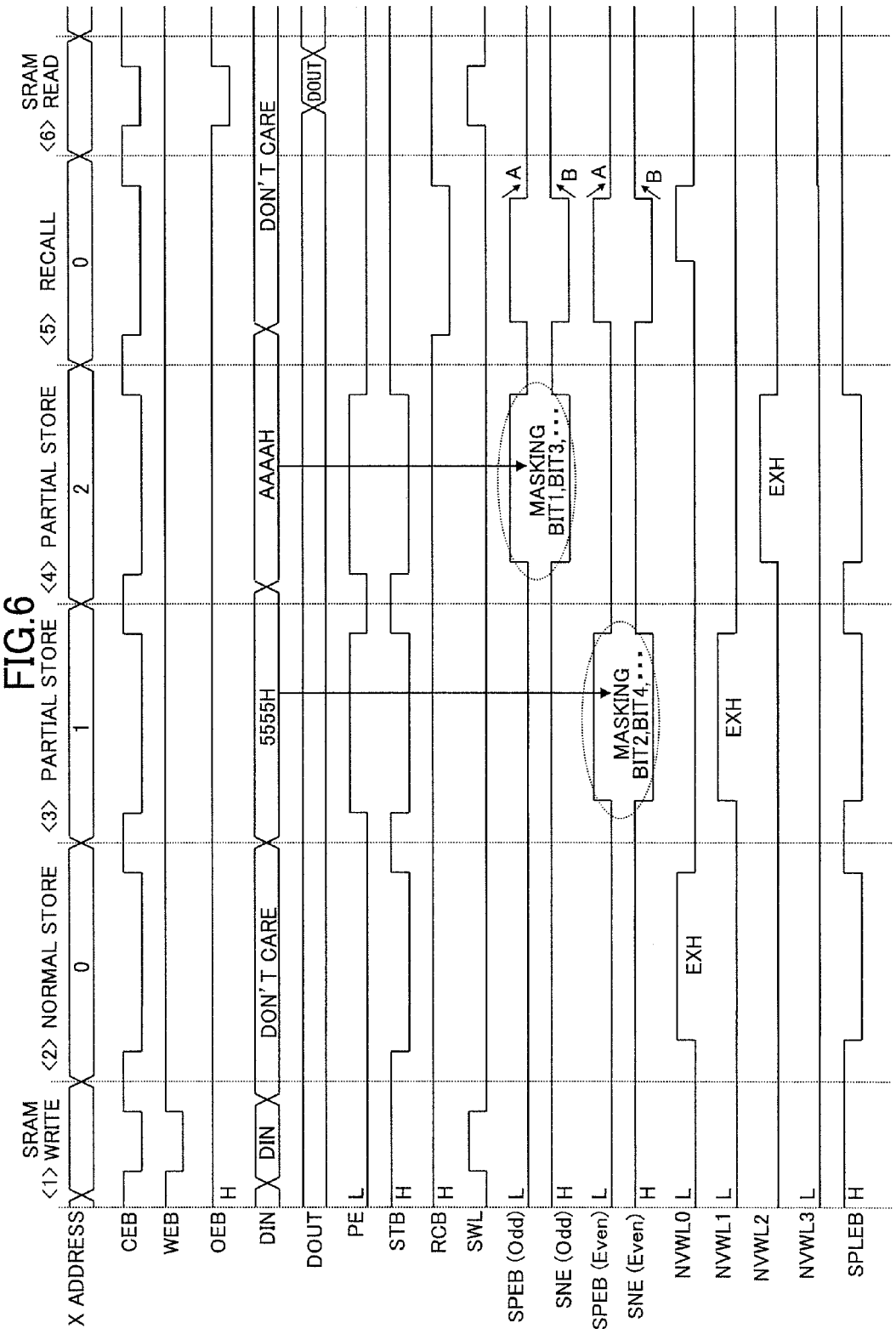
FIG. 6 is a timing chart for explaining operations of a nonvolatile semiconductor memory device shown in FIG. 5.

FIG. 6 is a timing chart for explaining operations of the nonvolatile semiconductor memory device shown in FIG. 5.

The first operation phase shown in FIG. 6 is the writing of data to the SRAM cell 50. The store enable signal STB, the recall enable signal RCB, the output enable signal OEB, the write enable signal WEB, and the chip enable signal CEB are set to respective signal levels as shown in FIG. 6. The X address and input data DIN are supplied to the X decoder 27 and to the DIN buffer 21, respectively (see FIG. 5). The X driver 28 activates a selected SRAM word lines SWL as shown in FIG. 6, which is selected by the X decoder 27 according to the supplied X address. As can be seen from FIG. 2, the activation of the SRAM word line SWL to HIGH causes the NMOS transistors 34 and 35 to become conductive. Since the SRAM data lines SLN and SLT are at the respective signal levels responsive to the input data DIN, the input data DIN is stored in the SRAM cell 50 through the NMOS transistors 34 and 35. The writing of data to the SRAM cell 50 is performed with respect to all the memory cell units 30 that are connected to the activated SRAM word line SWL (see FIG. 5).

The second operation phase shown in FIG. 6 is the normal storing of data of the SRAM cells 50 in the nonvolatile memory cells 51 without the masking of any bit positions. The store enable signal STB, the recall enable signal RCB, the output enable signal OEB, the write enable signal WEB, and the chip enable signal CEB are set to respective signal levels as shown in FIG. 6. The partial enable signal PE is set to LOW so as to indicate no masking operation. Because of the LOW state of the partial enable signal PE, all the SRAM NMOS enable lines SNE are set to HIGH, and all the SRAM PMOS enable lines SPEB are set to LOW. All the SRAM cells 50 in all the bit positions are thus placed in an active state. In this state, the store plate voltage enable line SPLEB is set to LOW, and the potential of the NV word line NVWL0 is set to EXH, thereby transferring the data from the SRAM cell 50 to the nonvolatile memory cell 51 in each memory cell unit 30 as described in connection with FIG. 3.

The third operation phase shown in FIG. 6 is the partial storing of data of the SRAM cells 50 in the nonvolatile memory cells 51 with the masking of even-number bit positions. The store enable signal STB, the recall enable signal RCB, the output enable signal OEB, the write enable signal WEB, and the chip enable signal CEB are set to respective signal levels as shown in FIG. 6. The partial enable signal PE is set to HIGH to indicate the performing of masking operation. The bit positions to be masked are specified by data input into the DIN buffer 21. In this case, the data input into the DIN buffer 21 is 5555h, which is equal to "0101010101010101" in binary representation. The bit positions where "0" is allocated are the positions to be masked among the 16 bit positions BIT1 through BIT16. At the even-number bit positions (BIT2, BIT4, BIT6, and so on), thus, the SRAM NMOS enable line SNE and the SRAM PMOS enable line SPEB are set to LOW and HIGH, respectively, thereby turning off both the NMOS transistor 36 and the PMOS transistor 41 to place the SRAM cell 50 in an inactive state. At the odd-number bit positions (BIT1, BIT3, BIT5, and so on), on the other hand, the SRAM NMOS enable line SNE and the SRAM PMOS enable line SPEB are set to HIGH and LOW, respectively, thereby turning on both the NMOS transistor 36 and the PMOS transistor 41 to place the SRAM cell 50 in an active state. When the store plate voltage enable line SPLEB is set to LOW, and the potential of the NV word line NVWL1 is set to EXH, the data is prevented from being transferred from the SRAM cell 50 to the nonvolatile memory cell 51 in each of the memory cell units 30 at the even-number bit positions as described in connection with FIG. 4, whereas data transfer is successfully performed at the odd-number bit positions.

The fourth operation phase shown in FIG. 6 is the partial storing of data of the SRAM cells 50 in the nonvolatile memory cells 51 with the masking of odd-number bit positions. The store enable signal STB, the recall enable signal RCB, the output enable signal OEB, the write enable signal WEB, and the chip enable signal CEB are set to respective signal levels as shown in FIG. 6. The partial enable signal PE is set to HIGH to indicate the performing of masking operation. The bit positions to be masked are specified by data input into the DIN buffer 21. In this case, the data input into the DIN buffer 21 is AAAAh, which is equal to "1010101010101010"

in binary representation. The bit positions where "0" is allocated are the positions to be masked among the 16 bit positions BIT1 through BIT16. At the odd-number bit positions (BIT1, BIT3, BIT5, and so on), thus, the SRAM NMOS enable line SNE and the SRAM PMOS enable line SPEB are set to LOW and HIGH, respectively, thereby turning off both the NMOS transistor 36 and the PMOS transistor 41 to place the SRAM cell 50 in an inactive state. At the even-number bit positions (BIT2, BIT4, BIT5, and so on), on the other hand, the SRAM NMOS enable line SNE and the SRAM PMOS enable line SPEB are set to HIGH and LOW, respectively, thereby turning on both the NMOS transistor 36 and the PMOS transistor 41 to place the SRAM cell 50 in an active state. When the store plate voltage enable line SPLEB is set to LOW, and the potential of the NV word line NVWL2 is set to EXH, the data is prevented from being transferred from the SRAM cell 50 to the nonvolatile memory cell 51 in each of the memory cell units 30 at the odd-number bit positions as described in connection with FIG. 4, whereas data transfer is successfully performed at the even-number bit positions.

The fifth operation phase shown in FIG. 6 is the recalling of data from the nonvolatile memory cells 51 to the SRAM cells 50. The store enable signal STB, the recall enable signal RCB, the output enable signal OEB, the write enable signal WEB, and the chip enable signal CEB are set to respective signal levels as shown in FIG. 4. Further, the partial enable signal PE is set to LOW. In order to recall (read) the data from the nonvolatile memory cells 51, the SRAM cells 50 are initially placed in an electrically inactive state, and are then shifted to an electrically active state. This is achieved by shifting the SRAM PMOS enable line SPEB from HIGH to LOW and the SRAM NMOS enable line SNE from LOW to HIGH as shown by arrows A and B in FIG. 6. Prior to the activation of the SRAM cells 50, one of the NV word lines NVWL0 through NVWL3 is set to HIGH to recall the data with respect to this selected word line (i.e., NVWL0 in the example shown in FIG. 6).

The sixth operation phase shown in FIG. 6 is the reading of data from the SRAM cells 50. The store enable signal STB, the recall enable signal RCB, the output enable signal OEB, the write enable signal WEB, and the chip enable signal CEB are set to respective signal levels as shown in FIG. 4. An X address to be accessed is supplied to the X decoder 27. The X driver 28 activates a SRAM word line SWL selected by the X decoder 27. In FIG. 2, the activation of the SRAM word line SWL to HIGH causes the NMOS transistors 34 and 35 to become conductive. It follows that the data stored in the SRAM cell 50 appear on the SRAM data lines SLN and SLT through the NMOS transistors 34 and 35. The data appearing on the SRAM data lines SLN and SLT are then output from the DOUT buffer 22 as the output data DOUT via the write-amplifier-&-sense-amplifier unit 24 (see FIG. 1 and FIG. 5). It should be noted that the reading of data from the SRAM cell 50 is performed with respect to all the memory cell units 30 that are connected to the activated SRAM word line SWL.

Figure 7:
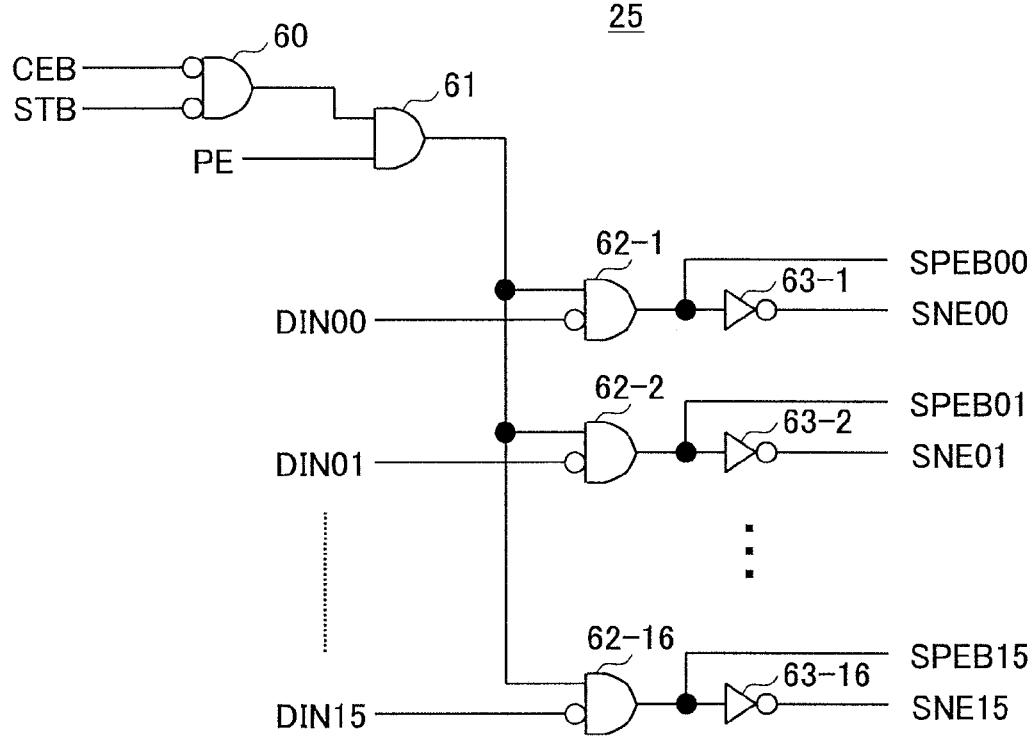
FIG. 7 is a drawing for explaining the bit-specific masking function achieved by a Y-switch-&-Y-decoder unit shown in FIG. 5.

FIG. 7 is a drawing for explaining the bit-specific masking function achieved by the Y-switch-&-Y-decoder unit 25 shown in FIG. 5. As shown in FIG. 7, a relevant portion of the Y-switch-&-Y-decoder unit 25 for performing the bit-specific masking function includes AND gates 60 and 61, AND gates 62-1 through 62-16, and inverters 63-1 through 63-16. The two inputs of the AND gate 60 are negative logic inputs, which means that the output of the AND gate 60 becomes HIGH only when the two inputs are LOW. One of the two inputs of the AND gate 62-1 is a negative logic input, which means that the output of the AND gate 62-1 becomes HIGH only when the positive logic input is HIGH and the negative logic input is LOW. The same applies to the AND gates 62-2 through 62-16.

When the chip enable signal CEB and the store enable signal STB are both set to LOW, and the partial enable signal PE is set to HIGH, the output of the AND gate 61 becomes HIGH. In response, the output of the AND gate 62-1 is set to HIGH if a first bit DIN00 of the input data DIN input into the DIN buffer 21 is LOW. The HIGH output of the AND gate 62-1 is supplied to the first bit of the selected row as an SRAM PMOS enable signal SPEB00 on the SRAM PMOS enable line SPEB. An inverse of the HIGH output of the AND gate 62-1 is supplied to the first bit of the selected row as an SRAM NMOS enable signal SNE00 on the SRAM NMOS enable line SNE. Accordingly, the SRAM cell 50 of the memory cell unit 30 at this first bit position is placed in an inactive state, so that the data of the SRAM cell 50 is not transferred to the nonvolatile memory cell 51 (see FIG. 4, for example).

Conversely, the output of the AND gate 62-1 is set to LOW if the first bit DIN00 of the input data DIN input into the DIN buffer 21 is HIGH. The LOW output of the AND gate 62-1 is supplied to the first bit of the selected row as an SRAM PMOS enable signal SPEB00 on the SRAM PMOS enable line SPEB. An inverse of the LOW output of the AND gate 62-1 is supplied to the first bit of the selected row as an SRAM NMOS enable signal SNE00 on the SRAM NMOS enable line SNE. Accordingly, the SRAM cell 50 of the memory cell unit 30 at this first bit position is placed in an active state, so that the data of the SRAM cell 50 is transferred to the nonvolatile memory cell 51 (see FIG. 3, for example).

As described above, whether the first bit of the input data DIN is 0 or 1 determines whether the first bit is masked in the store operation. DIN00 being "0" causes the first bit to be masked, and DIN00 being "1" causes the first bit to be not masked. The same applies to the remaining bits DIN01 through DIN15. It should also be noted that all the SRAM PMOS enable signals SPEB00 through SPEB15 are set to LOW, and all the SRAM NMOS enable signals SNE00 through SNE15 are set to HIGH if the partial enable signal PE is set to LOW. No bit is masked in this case.

Figure 8:
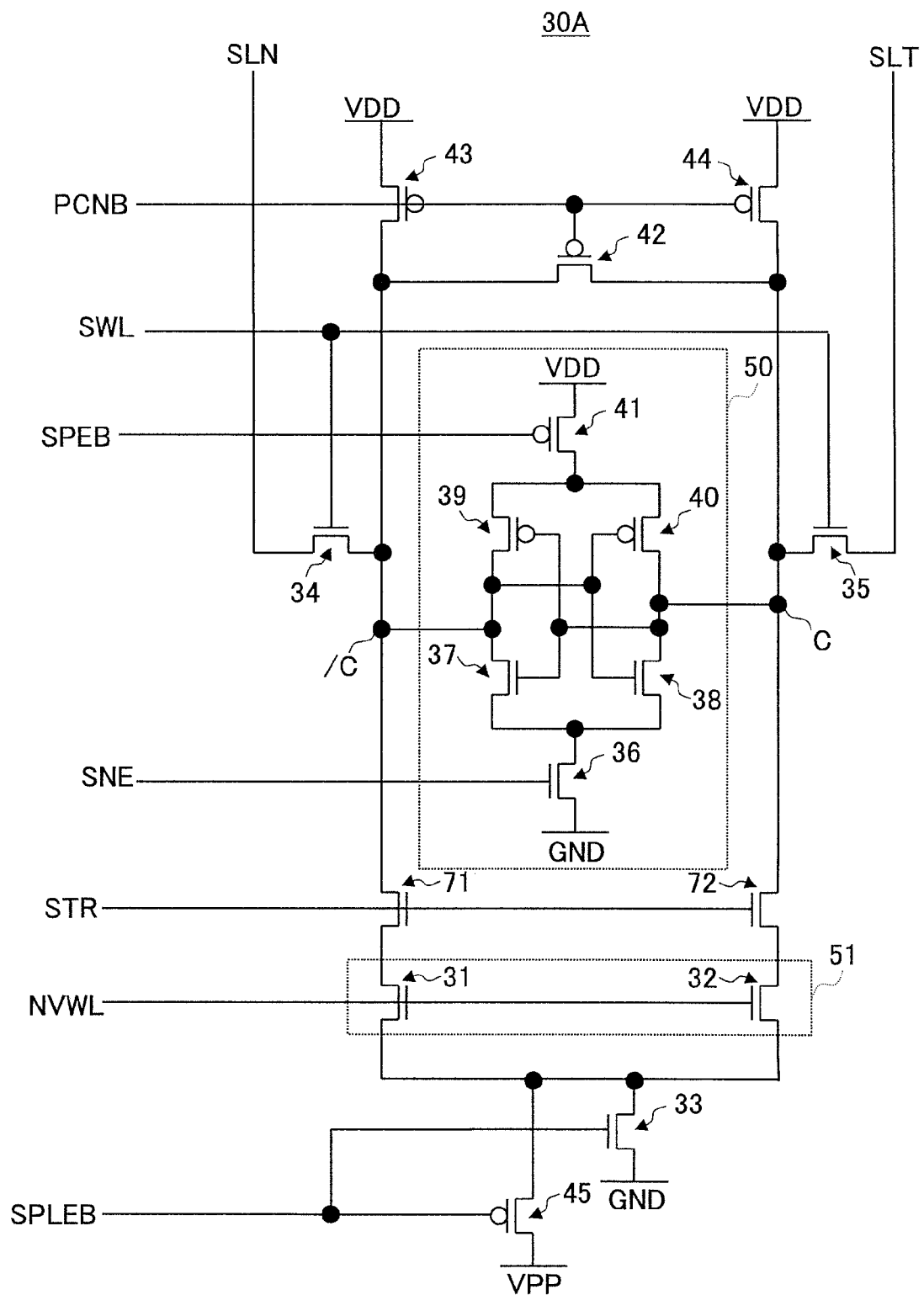
FIG. 8 is an illustrative drawing showing a variation of the memory cell unit used in the memory cell array of FIG. 1.

FIG. 8 is an illustrative drawing showing a variation of the memory cell unit used in the memory cell array 29 of FIG. 1. Each memory cell unit of the memory cell array 29 may have the circuit configuration as shown in FIG. 8. In FIG. 8, the same elements as those of FIG. 2 are referred to by the same numerals, and a description thereof will be omitted.

A memory cell unit 30A of FIG. 8 includes NMOS transistors 71 and 72 in addition to the NMOS transistors 31 through 38 and the PMOS transistors 39 through 45 shown in FIG. 2. The gates of the NMOS transistors 71 and 72 are coupled to a partial store enable signal STR. This partial store enable signal STR is supplied from the Y-switch-&-Y-decoder unit 25, and is controlled on a bit-specific basis in the same manner as the SRAM NMOS enable signals SNE00 through SNE15 shown in FIG. 7. Namely, the circuit configuration of the Y-switch-&-Y-decoder unit 25 shown in FIG. 7 may be used to generate the partial store enable signals STR (e.g., STR00 through STR15) in place of the SRAM NMOS enable signals SNE00 through SNE15. In the memory cell unit 30A of FIG. 8, the SRAM NMOS enable line SNE and the SRAM PMOS enable line SPEB extend from the X driver 28 rather than from the Y-switch-&-Y-decoder unit 25, and are not controlled on a bit-specific basis.

Figure 9:
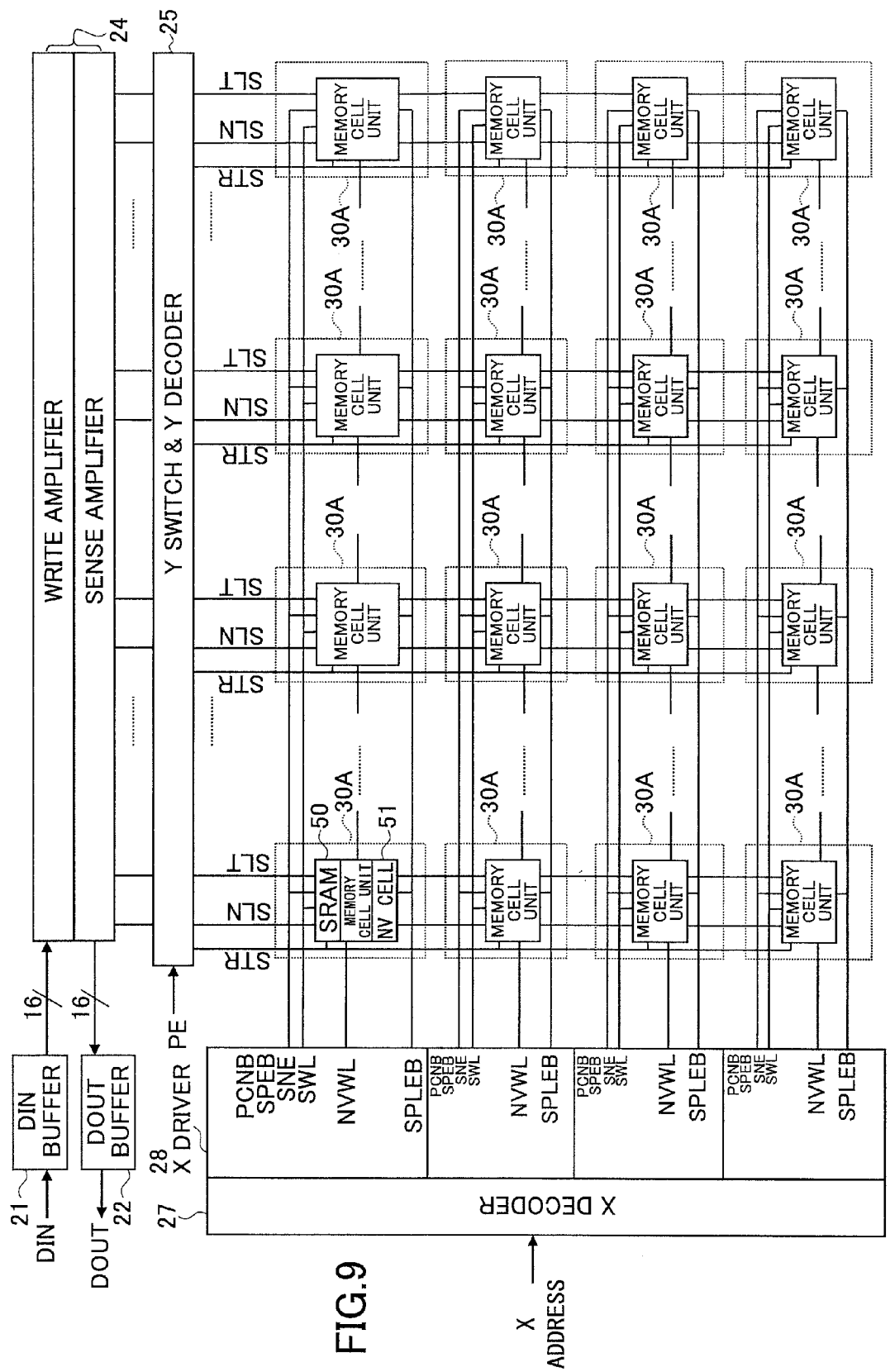
FIG. 9 is a drawing showing a more specific configuration of the memory cell array shown in FIG. 1 when the memory cell unit of FIG. 8 is employed.

FIG. 9 is a drawing showing a more specific configuration of the memory cell array 29 shown in FIG. 1 when the memory cell unit 30A of FIG. 8 is employed. In FIG. 9, the same elements as those of FIG. 5 are referred to by the same numerals, and a description thereof will be omitted.

The X driver 28 may activate one of the NV word lines NVWL0 through NVWL3 at the time of storing data from the SRAM cells 50 to the nonvolatile memory cells 51 and at the time of recalling data to the SRAM cells 50 from the nonvolatile memory cells 51. Alternatively, the X driver 28 may activate all the NV word lines NVWL0 through NVWL3 at once for both the store operation and the recall operation. Choice between these two arrangements may be made according to need.

The Y-switch-&-Y-decoder unit 25 sets the partial store enable signals STR to HIGH with respect to the bit positions at which data should be transferred from the SRAM cell 50 to the nonvolatile memory cell 51 during store operation. The Y-switch-&-Y-decoder unit 25 sets the partial store enable signal STR to LOW with respect to the bit positions at which data should be masked and prevented from being transferred from the SRAM cell 50 to the nonvolatile memory cell 51 during the store operation.

The SRAM NMOS enable lines SNE and the SRAM PMOS enable lines SPEB extend from the X driver 28 rather than from the Y-switch-&-Y-decoder unit 25. With this arrangement, the SRAM NMOS enable lines SNE and the SRAM PMOS enable lines SPEB are controllable on a row-specific basis (i.e., on a word-line specific basis), and are not controlled on a bit-specific basis.

Figure 10:
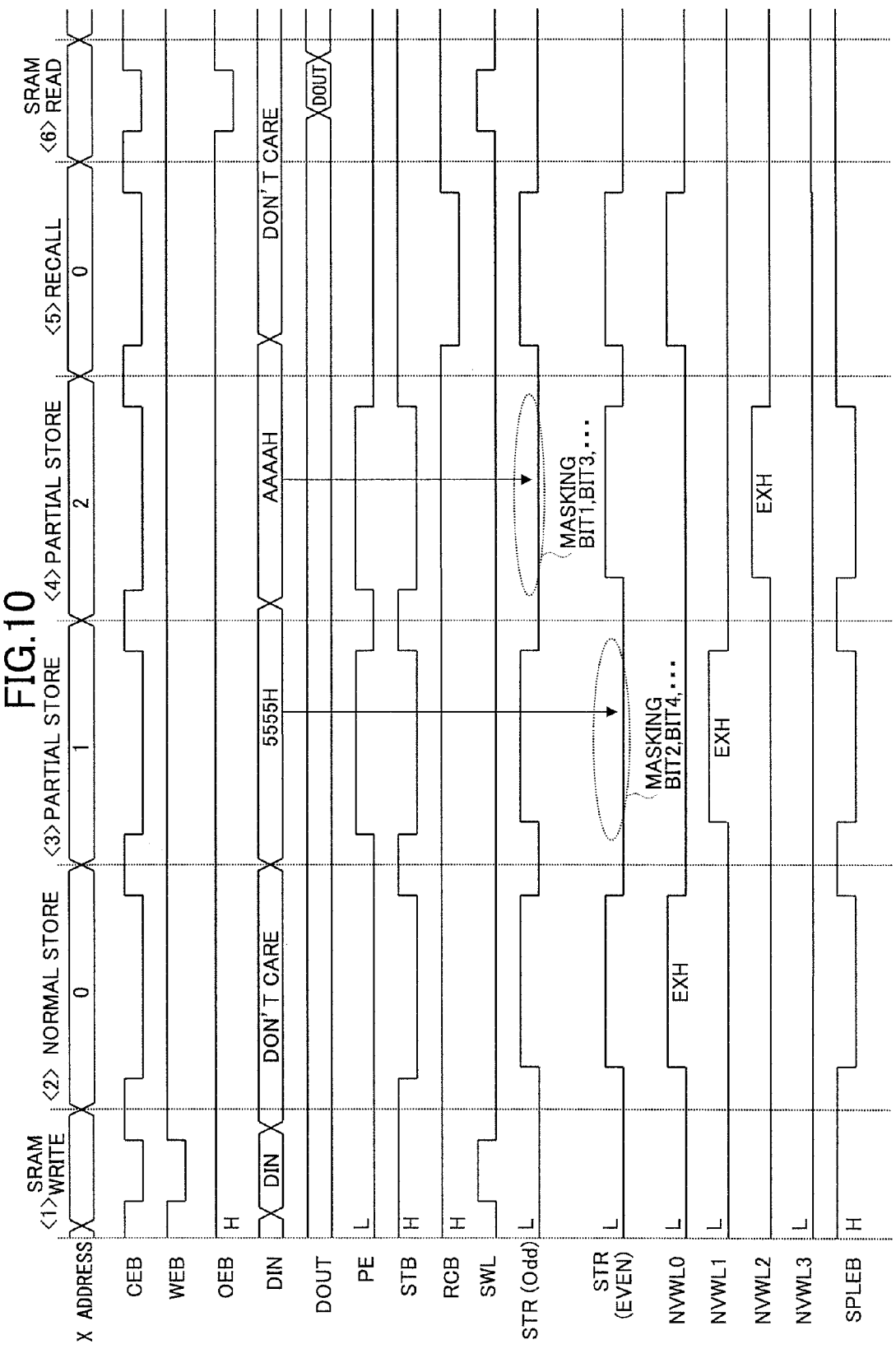
FIG. 10 is a timing chart for explaining operations of a nonvolatile semiconductor memory device shown in FIG. 9.

FIG. 10 is a timing chart for explaining operations of the nonvolatile semiconductor memory device shown in FIG. 9.

The first operation phase shown in FIG. 10 is the writing of data to the SRAM cells 50. This operation is substantially the same as the writing of data at the first operation phase illustrated in FIG. 6.

The second operation phase shown in FIG. 6 is the normal storing of data of the SRAM cells 50 in the nonvolatile memory cells 51 without the masking of any bit positions. In order for data of the SRAM cells 50 to be transferred to the nonvolatile memory cells 51, the NMOS transistors 71 and 72 shown in FIG. 8 must be in a conductive state. All the partial store enable signals STR should thus be set to HIGH as shown in FIG. 10. Other than the setting of the partial store enable signals STR, the details of the normal store operation without masking are substantially the same as the normal store operation performed at the second operation phase illustrated in FIG. 6.

The third operation phase shown in FIG. 10 is the partial storing of data of the SRAM cells 50 in the nonvolatile memory cells 51 with the masking of even-number bit positions. The store enable signal STB, the recall enable signal RCB, the output enable signal OEB, the write enable signal WEB, and the chip enable signal CEB are set to respective signal levels as shown in FIG. 10. The partial enable signal PE is set to HIGH to indicate the performing of masking operation. The bit positions to be masked are specified by data input into the DIN buffer 21. In this case, the data input into the DIN buffer 21 is 5555h, which is equal to "0101010101010101" in binary representation. The bit positions where "0" is allocated are the positions to be masked among the 16 bit positions BIT1 through BIT16. At the even-number bit positions (BIT2, BIT4, BIT6, and so on), thus, the partial store enable signal STR is set to LOW, thereby turning off both the NMOS transistors 71 and 72 to disconnect the SRAM cell 50 from the nonvolatile memory cell 51. At the odd-number bit positions (BIT1, BIT3, BIT5, and so on), on the other hand, the partial store enable signal STR is set to HIGH, thereby turning on both the NMOS transistors 71 and 72 to establish electrical connection between the SRAM cell 50 and the nonvolatile memory cell 51. When the store plate voltage enable line SPLEB is set to LOW, and the potential of the NV word line NVWL1 is set to EXH, data is prevented from being transferred from the SRAM cell 50 to the nonvolatile memory cell 51 in each of the memory cell units 30A at the even-number bit positions, whereas data transfer is successfully performed at the odd-number bit positions.

The fourth operation phase shown in FIG. 10 is the partial storing of data of the SRAM cells 50 in the nonvolatile memory cells 51 with the masking of odd-number bit positions. The store enable signal STB, the recall enable signal RCB, the output enable signal OEB, the write enable signal WEB, and the chip enable signal CEB are set to respective signal levels as shown in FIG. 10. The partial enable signal PE is set to HIGH to indicate the performing of masking operation. The bit positions to be masked are specified by data input into the DIN buffer 21. In this case, the data input into the DIN buffer 21 is AAAAh, which is equal to "1010101010101010" in binary representation. The bit positions where "0" is allocated are the positions to be masked among the 16 bit positions BIT1 through BIT16. At the odd-number bit positions (BIT1, BIT3, BIT5, and so on), thus, the partial store enable signal STR is set to LOW, thereby turning off both the NMOS transistors 71 and 72 to disconnect the SRAM cell 50 from the nonvolatile memory cell 51. At the even-number bit positions (BIT2, BIT4, BIT6, and so on), on the other hand, the partial store enable signal STR is set to HIGH, thereby turning on both the NMOS transistors 71 and 72 to establish electrical connection between the SRAM cell 50 and the nonvolatile memory cell 51. When the store plate voltage enable line SPLEB is set to LOW, and the potential of the NV word line NVWL2 is set to EXH, data is prevented from being transferred from the SRAM cell 50 to the nonvolatile memory cell 51 in each of the memory cell units 30A at the odd-number bit positions, whereas data transfer is successfully performed at the even-number bit positions.

The fifth operation phase shown in FIG. 6 is the recalling of data from the nonvolatile memory cells 51 to the SRAM cells 50. In order for data of the nonvolatile memory cells 51 to be transferred to the SRAM cells 50, the NMOS transistors 71 and 72 shown in FIG. 8 must be in a conductive state. All the partial store enable signals STR should thus be set to HIGH as shown in FIG. 10. Other than the setting of the partial store enable signals STR, the details of the recall operation are substantially the same as the recall operation performed at the fifth operation phase illustrated in FIG. 6.

The sixth operation phase shown in FIG. 10 is the reading of data from the SRAM cells 50. This operation is substantially the same as the reading of data performed at the sixth operation phase illustrated in FIG. 6.

Figure 11:
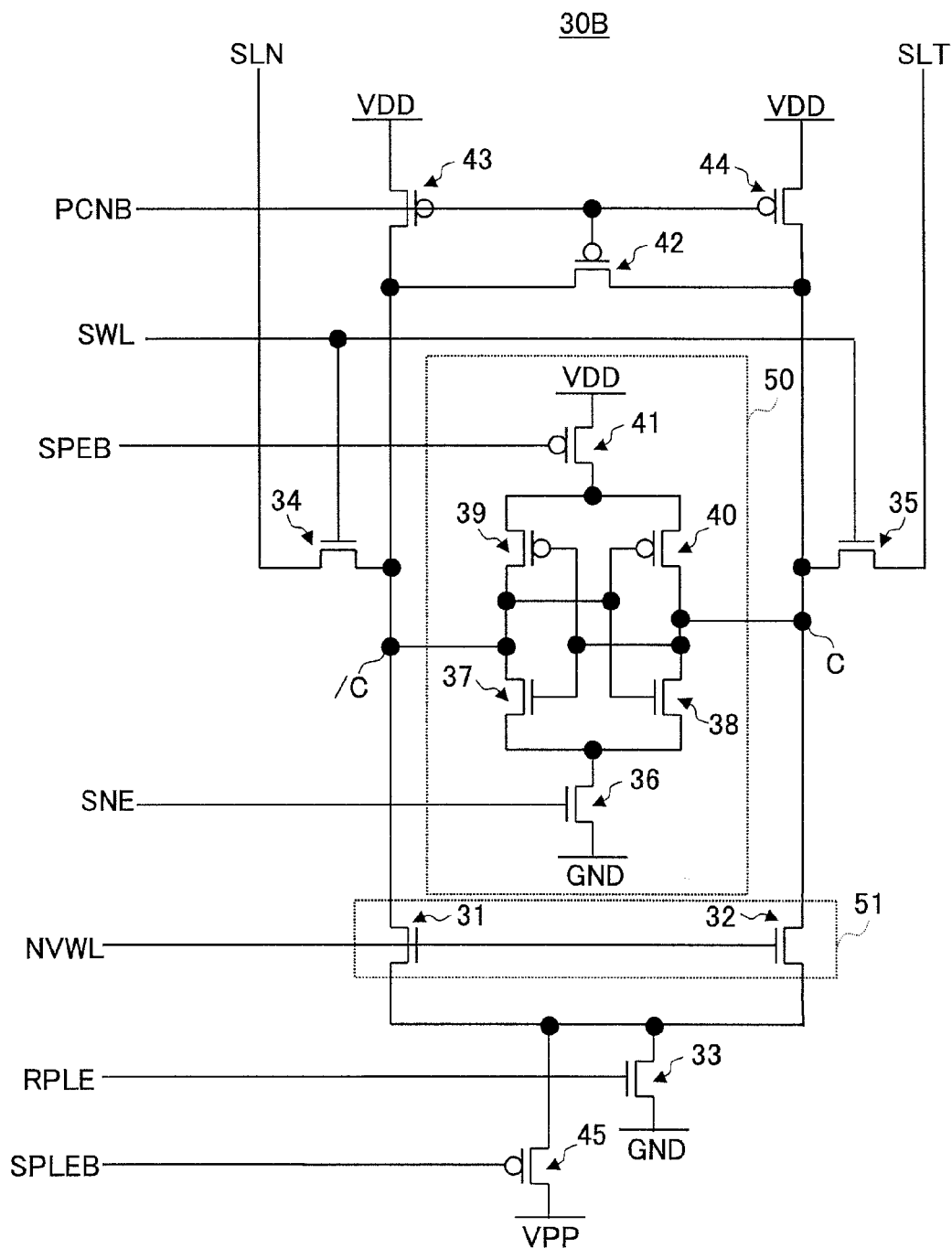
FIG. 11 is an illustrative drawing showing another variation of the memory cell unit used in the memory cell array of FIG. 1.

FIG. 11 is an illustrative drawing showing another variation of the memory cell unit used in the memory cell array 29 of FIG. 1. Each memory cell unit of the memory cell array 29 may have the circuit configuration as shown in FIG. 11. In FIG. 11, the same elements as those of FIG. 2 are referred to by the same numerals, and a description thereof will be omitted.

A memory cell unit 30B of FIG. 11 differs from the memory cell unit 30 shown in FIG. 2 only in that the gate of the NMOS transistor 33 is coupled to a recall plate voltage enable line RPLE while the gate of the PMOS transistor 45 remains to be coupled to the store plate voltage enable line SPLEB. This configuration allows the gate of the NMOS transistor 33 and the gate of the PMOS transistor 45 to be separately controlled. During store operation, the store plate voltage enable line SPLEB may be set to HIGH to turn off the PMOS transistor 45 for the purpose of enabling a masking function while the recall plate voltage enable line RPLE is set to LOW to turn off the NMOS transistor 33.

The store plate voltage enable line SPLEB is coupled to the Y-switch-&-Y-decoder unit 25, and is controlled on a bit-specific basis in the same manner as the SRAM NMOS enable signals SNE00 through SNE15 shown in FIG. 7. Namely, the circuit configuration of the Y-switch-&-Y-decoder unit 25 shown in FIG. 7 may be used to generate signals on the store plate voltage enable lines SPLEB in place of the SRAM NMOS enable signals SNE00 through SNE15. In the memory cell unit 30B of FIG. 11, the SRAM NMOS enable line SNE and the SRAM PMOS enable line SPEB extend from the X driver 28 rather than from the Y-switch-&-Y-decoder unit 25, and are not controlled on a bit-specific basis. The recall plate voltage enable line RPLE also extends from the X driver 28, and is not controlled on a bit-specific basis.

Figure 12:
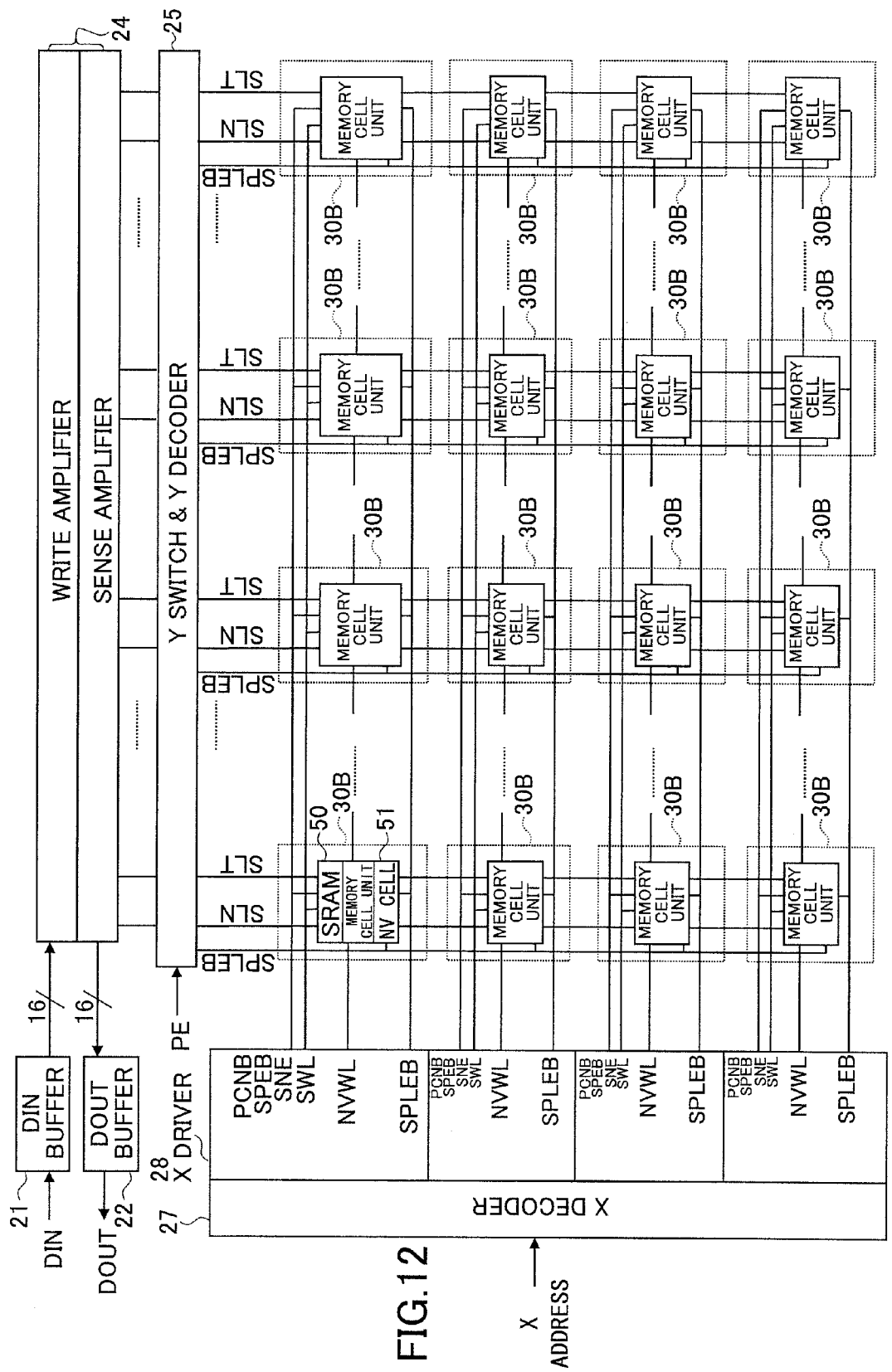
FIG. 12 is a drawing showing a more specific configuration of the memory cell array shown in FIG. 1 when the memory cell unit of FIG. 11 is employed.

FIG. 12 is a drawing showing a more specific configuration of the memory cell array 29 shown in FIG. 1 when the memory cell unit 30B of FIG. 11 is employed. In FIG. 12, the same elements as those of FIG. 5 are referred to by the same numerals, and a description thereof will be omitted.

The Y-switch-&-Y-decoder unit 25 sets the store plate voltage enable lines SPLEB to LOW with respect to the bit positions at which data should be transferred from the SRAM cell 50 to the nonvolatile memory cell 51 during store operation. The Y-switch-&-Y-decoder unit 25 sets the store plate voltage enable lines SPLEB to HIGH with respect to the bit positions at which data should be masked and prevented from being transferred from the SRAM cell 50 to the nonvolatile memory cell 51 during the store operation.

The SRAM NMOS enable lines SNE and the SRAM PMOS enable lines SPEB extend from the X driver 28 rather than from the Y-switch-&-Y-decoder unit 25. With this arrangement, the SRAM NMOS enable lines SNE and the SRAM PMOS enable lines SPEB are controllable on a row-specific basis (i.e., on a word-line specific basis), and are not controlled on a bit-specific basis. Further, the recall plate voltage enable lines RPLE also extend from the X driver 28. With this provision, the recall plate voltage enable lines RPLE are controllable on a row-specific basis (i.e., on a word-line specific basis), and are not controlled on a bit-specific basis.

Figure 13:
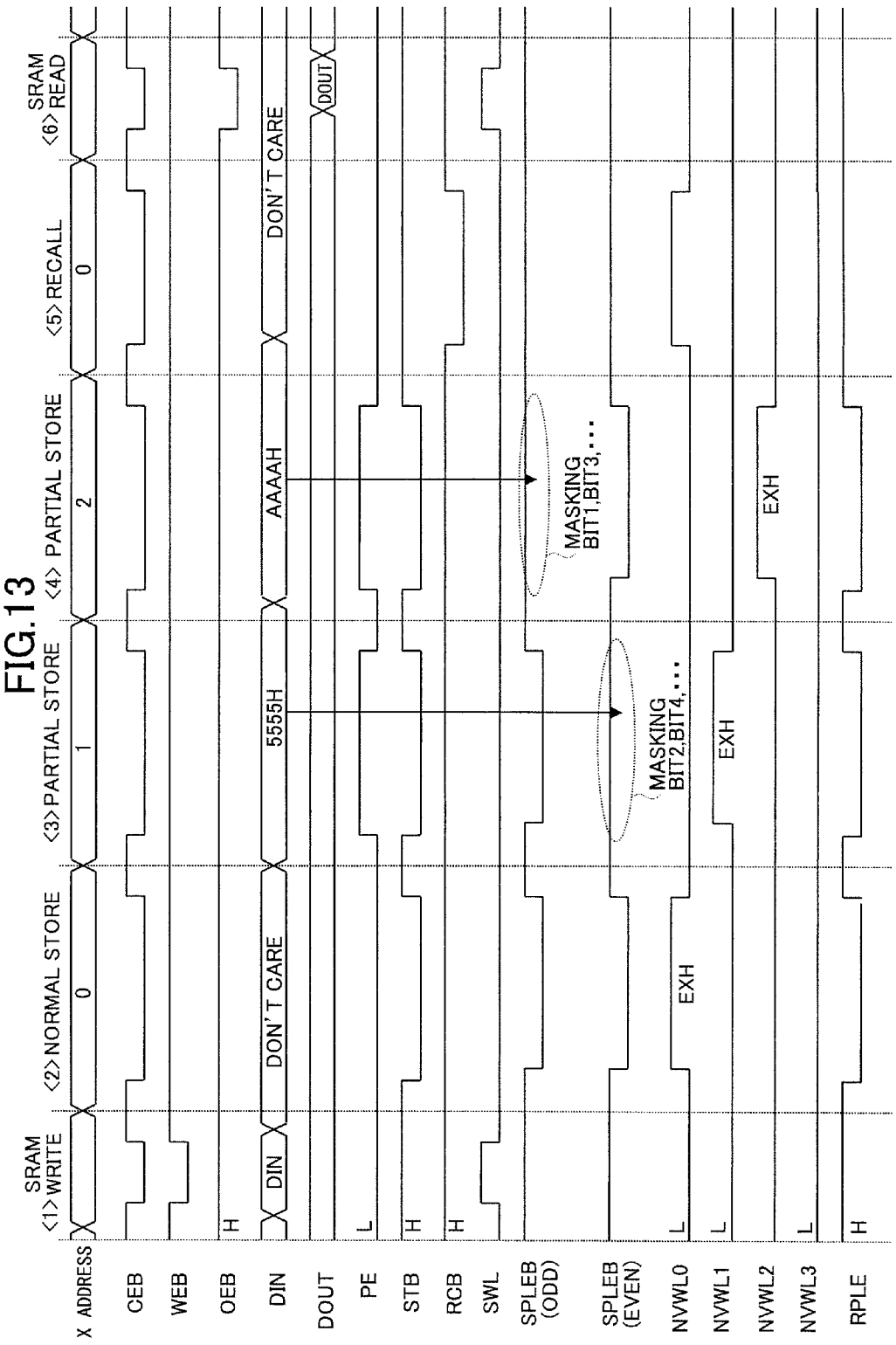
FIG. 13 is a timing chart for explaining operations of a nonvolatile semiconductor memory device shown in FIG. 12.

FIG. 13 is a timing chart for explaining operations of the nonvolatile semiconductor memory device shown in FIG. 12.

The first operation phase shown in FIG. 13 is the writing of data to the SRAM cells 50. This operation is substantially the same as the writing of data at the first operation phase illustrated in FIG. 6.

The second operation phase shown in FIG. 13 is the normal storing of data of the SRAM cells 50 in the nonvolatile memory cells 51 without the masking of any bit positions. At all the bit positions, the store plate voltage enable line SPLEB is set to LOW to turn on the PMOS transistor 45 (see FIG. 11) for the purpose of creating a hot carrier effect while the recall plate voltage enable line RPLE is set to LOW to turn off the NMOS transistor 33. Other than the separate control of the store plate voltage enable line SPLEB and the recall plate voltage enable line RPLE, the details of the normal store operation without masking are substantially the same as the normal store operation performed at the second operation phase illustrated in FIG. 6.

The third operation phase shown in FIG. 13 is the partial storing of data of the SRAM cells 50 in the nonvolatile memory cells 51 with the masking of even-number bit positions. The store enable signal STB, the recall enable signal RCB, the output enable signal OEB, the write enable signal WEB, and the chip enable signal CEB are set to respective signal levels as shown in FIG. 13. The partial enable signal PE is set to HIGH to indicate the performing of masking operation. The bit positions to be masked are specified by data input into the DIN buffer 21. In this case, the data input into the DIN buffer 21 is 5555h, which is equal to "0101010101010101" in binary representation. The bit positions where "0" is allocated are the positions to be masked among the 16 bit positions BIT1 through BIT16. At the even-number bit positions (BIT2, BIT4, BIT6, and so on), thus, the store plate voltage enable line SPLEB is set to HIGH, thereby turning off the PMOS transistor 45 to prevent a hot carrier effect (see FIG. 11). At the odd-number bit positions (BIT1, BIT3, BIT5, and so on), on the other hand, the store plate voltage enable line SPLEB is set to LOW, thereby turning on the PMOS transistor 45 to create a hot carrier effect. The recall plate voltage enable line RPLE is set to LOW to turn off the NMOS transistor 33 at all the bit positions. When the potential of the NV word line NVWL1 is set to EXH, data is prevented from being transferred from the SRAM cell 50 to the nonvolatile memory cell 51 in each of the memory cell units 30B at the even-number bit positions, whereas data transfer is successfully performed at the odd-number bit positions.

The fourth operation phase shown in FIG. 13 is the partial storing of data of the SRAM cells 50 in the nonvolatile memory cells 51 with the masking of odd-number bit positions. The store enable signal STB, the recall enable signal RCB, the output enable signal OEB, the write enable signal WEB, and the chip enable signal CEB are set to respective signal levels as shown in FIG. 10. The partial enable signal PE is set to HIGH to indicate the performing of masking operation. The bit positions to be masked are specified by data input into the DIN buffer 21. In this case, the data input into the DIN buffer 21 is AAAAh, which is equal to "1010101010101010" in binary representation. The bit positions where "0" is allocated are the positions to be masked among the 16 bit positions BIT1 through BIT16. At the odd-number bit positions (BIT1, BIT3, BIT5, and so on), thus, the store plate voltage enable line SPLEB is set to HIGH, thereby turning off the PMOS transistor 45 to prevent a hot carrier effect (see FIG. 11). At the odd-number bit positions (BIT2, BIT4, BIT6, and so on), on the other hand, the store plate voltage enable line SPLEB is set to LOW, thereby turning on the PMOS transistor 45 to create a hot carrier effect. The recall plate voltage enable line RPLE is set to LOW to turn off the NMOS transistor 33 at all the bit positions. When the potential of the NV word line NVWL2 is set to EXH, data is prevented from being transferred from the SRAM cell 50 to the nonvolatile memory cell 51 in each of the memory cell units 30B at the odd-number bit positions, whereas data transfer is successfully performed at the even-number bit positions.

The fifth operation phase shown in FIG. 6 is the recalling of data from the nonvolatile memory cells 51 to the SRAM cells 50. For the recall operation, the recall plate voltage enable line RPLE is set to HIGH to turn on the NMOS transistor 33 at all the bit positions while all the store plate voltage enable lines SPLEB are set to HIGH to turn off the respective PMOS transistors 45. Other than the separate control of the store plate voltage enable line SPLEB and the recall plate voltage enable line RPLE, the details of the recall operation are substantially the same as the recall operation performed at the fifth operation phase illustrated in FIG. 6.

The sixth operation phase shown in FIG. 13 is the reading of data from the SRAM cells 50. This operation is substantially the same as the reading of data performed at the sixth operation phase illustrated in FIG. 6.

In the various embodiments described above, bit-specific masking is performed so as to prevent data from being transferred from the SRAM cell 50 to the nonvolatile memory cell 51 on a selected bit position. It should be noted that such arrangement is different from an arrangement in which a selected portion of the input data is not supplied to the memory cell array 29 so as to mask the selected portion. This masking may prevent the selected portion of the input data from being written to the SRAM cells 50. When a subsequent store operation is performed, however, unknown data of the masked SRAM cells 50, which come into existence because the SRAM cells 50 are bound to assume one of the two states corresponding to "1" and "0", are also stored in the nonvolatile memory cells 51. In consideration of this, the embodiments described above provide the mask function by preventing data transfer from an SRAM cell 50 to a nonvolatile memory cell 51, rather than preventing data from being written to the SRAM cell 50.

Further, the present invention is not limited to these embodiments, but various variations and modifications may be made without departing from the scope of the present invention.

What is claimed is:

1. A nonvolatile semiconductor memory device, comprising:
    a data input buffer to receive input data;
    a plurality of control lines;
    a control circuit configured to assert selected ones of the control lines; and
    a plurality of memory cell units arranged in rows and columns and including respective latch circuits and respective nonvolatile memory cells, each nonvolatile memory cell being coupled to a corresponding latch circuit in a corresponding memory cell unit, the memory cell units on a common row being coupled to the respective control lines,
    wherein the memory cell units are configured to perform a write operation in which the latch circuits of the memory cell units on a selected row store respective bits of the input data, and are further configured to perform a store operation in which the respective bits of the input data are transferred from the latch circuits to the nonvolatile memory cells for storage therein in response to assertion of respective control lines by the control circuit, so that only one or more selective bits of the input data selected by the control circuit are stored in the nonvolatile memory cells.

2. The nonvolatile semiconductor memory device as claimed in claim 1, wherein each nonvolatile memory cell includes two MIS transistors and configured to store a corresponding bit of the input data as an irreversible change of transistor characteristics occurring in one of the two MIS transistors.

3. The nonvolatile semiconductor memory device as claimed in claim 2, wherein which one of the two MIS transistors experiences the irreversible change of transistor characteristics depends on what data is stored in the corresponding latch circuit.

4. The nonvolatile semiconductor memory device as claimed in claim 2, wherein the memory cell units are further configured to perform a recall operation in which each latch circuit senses data stored in the corresponding nonvolatile memory cell in response to the irreversible change of transistor characteristics in one of the two MIS transistors of the corresponding nonvolatile memory cell.

5. The nonvolatile semiconductor memory device as claimed in claim 2, wherein each latch circuit includes a first node and a second node configured to be bi-stable with a potential of the first node inverse to a potential of the second node, and wherein a first one of the two MIS transistors has one of source/drain nodes thereof coupled to the first node of the latch circuit, another one of the source/drain nodes thereof coupled to a predetermined node, and a gate node thereof coupled to a word selecting line, and a second one of the two MIS transistors has one of source/drain nodes thereof coupled to the second node of said latch circuit, another one of the source/drain nodes thereof coupled to said predetermined node, and a gate node thereof coupled to said word selecting line.

6. The nonvolatile semiconductor memory device as claimed in claim 2, wherein the control lines are configured to control activation/deactivation of the respective latch circuits.

7. The nonvolatile semiconductor memory device as claimed in claim 2, wherein the control lines are configured to control whether the two MIS transistors of the respective nonvolatile memory cells are placed under bias conditions that create the irreversible change of transistor characteristics in one of the two MIS transistors.

8. The nonvolatile semiconductor memory device as claimed in claim 2, wherein the control lines are configured to control whether to establish electrical connection between the respective latch circuits and the respective nonvolatile memory cells.

9. The nonvolatile semiconductor memory device as claimed in claim 1, wherein the control circuit is configured to assert selected ones of the control lines in response to mask data input into the data input buffer.

10. The nonvolatile semiconductor memory device as claimed in claim 1, wherein the control circuit is configured to assert selected ones of the control lines in response to assertion of an enable signal supplied from outside the nonvolatile semiconductor memory device, and is configured to assert all the control lines in response to negation of the enable signal supplied from outside the nonvolatile semiconductor memory device.

11. The nonvolatile semiconductor memory device as claimed in claim 1, wherein the control lines extend in a column direction perpendicularly to a row direction.

* * * * *